United States Patent [19]
Kuroda et al.

[11] Patent Number: 4,819,036
[45] Date of Patent: Apr. 4, 1989

[54] SEMICONDUCTOR DEVICE

[75] Inventors: Takao Kuroda; Akiyoshi Watanabe, Koganei; Shinji Tsuji, Hachioji; Akio Ohishi, Kokubunji; Hiroyoshi Matsumura, Saitama, all of Japan

[73] Assignee: Hitachi, Ltd., Tokyo, Japan

[21] Appl. No.: 60,869

[22] PCT Filed: Aug. 29, 1986

[86] PCT No.: PCT/JP86/00443
§ 371 Date: May 4, 1987
§ 102(e) Date: May 4, 1987

[87] PCT Pub. No.: WO87/01522
PCT Pub. Date: Mar. 12, 1987

[30] Foreign Application Priority Data

Sep. 4, 1985 [JP] Japan ................ 60-193739

[51] Int. Cl.$^4$ ............................ H01G 27/12
[52] U.S. Cl. ............................ 357/4; 357/16; 357/30
[58] Field of Search ............ 357/45 L, 16, 30

[56] References Cited
U.S. PATENT DOCUMENTS

| | | | |
|---|---|---|---|
| 4,250,515 | 2/1981 | Esaki | 357/4 |
| 4,688,068 | 8/1987 | Chaffin | 357/30 |
| 4,731,641 | 3/1988 | Matsushima | 357/4 |

FOREIGN PATENT DOCUMENTS 0206117 12/1986 European Pat. Off. .
60-7121 1/1985 Japan .

OTHER PUBLICATIONS

Tsang, Appl. Phys. Lett.; 44(3), Feb. 1, 1984, pp. 288–289.
Capasso et al., Appl. Phys. Lett., 45(11), Dec. 1, 1984, pp. 1194 et seq.
Kodama et al., Fujitsu Sci. Tech., J. 21, 1, pp. 31–39, Mar. 1985.

Primary Examiner—Martin H. Edlow
Attorney, Agent, or Firm—Antonelli, Terry & Wands

[57] ABSTRACT

A novel method which enables a quaternary III–V group crystal to be readily formed on a III–V group crystal so that the former crystal lattice-matches with the latter crystal. More specifically, it is easy to produce a superlattice structure on a III–V group crystal substrate, the superlattice structure consisting of a first III–V group (hereinafter referred to as "III$^1$–V$^1$") binary crystal layer which lattice-matches with the substrate, and a III–V group (III$^1$–III$^2$–V$^2$) ternary crystal layer which similarly lattice-matches with the substrate. It is possible to obtain an even more stable superlattice layer by selecting the ratio between the film thickness of the (III$^1$–V$^1$) crystal and the film thickness of the (III$^1$–III$^2$–V$^2$) crystal so that, when the superlattice structure is mixed-crystallized spontaneously or by means of impurity doping, the mixed-crystallized composition lattice-matches with the previous crystal.

18 Claims, 2 Drawing Sheets

SEMICONDUCTOR DEVICE

DESCRIPTION

1. Technical Field

The present invention relates to application of a superlattice semiconductor layer to a semiconductor device such as a semiconductor laser, a light emitting diode, a photodiode, an FET and a bipolar transistor, the semiconductor layer being made of a multi-element compound semiconductor which consists of three or less elements and which has an energy band width equivalent in size to a quaternary compound semiconductor.

2. Background Art

By virtue of the development of MOCVD (Metal Organic Chemical Vapor Deposition) and MBE (Molecular Beam Epitaxy), a compound semiconductor device having its thickness controlled so as to be substantially equal to the thickness of a single atom layer has recently been proposed.

One type of semiconductor device which utilizes an energy band width of a multi-element compound consisting of four or more elements has also attracted special interest recently. However, the technique of forming a quaternary compound semiconductor having a film thickness of 100 Å or less, particularly one which consists of two different elements in each of the two different groups e.g., InGaAsP on a III-V group substrate in a lattice matched state still involves many problems in terms of controllability (see H. Kressel et al, "Semiconductor Lasers and Heterojunction LEDs", pp.304 to 318, Academic Press, (1977).

DISCLOSURE OF INVENTION

The symbols $III^1$, $III^2$, $V^1$ and $V^2$ hereinafter denote, a first III-group element, a second III-group element, a first V-group element and a second V-group element, respectively.

The present inventors have found that a superlattice structure, which consists of a first III-V group (hereinafter referred to as "$III^1-V^1$") binary crystal layer formed on a III-V group crystal substrate and lattice-matching with the substrate and a III-V group ($III^1-III^2-V^2$) ternary crystal layer composed of two different III-group elements and a V-group element and also lattice-matching with the substrate, is easy to produce and has an average energy band gap (width) equivalent in size to a $III^14$ V group ($III^1-III^2-V^1-V^2$) quaternary crystal layer. The present inventors have, after further exhaustive study, found that a superlattice structure formed so that the ratio of the film thickness ($L_2$) of the $III^1-V^1$ binary crystal layer and the film thickness ($L_3$) of the $III^1-III^2-V^2$ ternary crystal layer, i.e., $L_2/L_3$, is coincident with a value determined by the calculation described later maintains its lattice-matching state with the substrate even after mixed crystallization spontaneously occurring during growth or mixed crystallization caused by Zn diffusion or Si implantation, and the superlattice structure is thus extremely stable.

More specifically, the feature of the present invention resides in the employment of a superlattice structure composed of ($III^1-V^1$) binary and ($III^1-III^2-V^2$) ternary mixed crystals (which lattice-match with a substrate concerned) in place of a ($III^1-III^2-V^1-V^2$) quaternary crystal layer which is formed on a III-V group binary mixed crystal ($III^1-V^1$) such as GaAs and which lattice-matches with the substrate. In other words, the present invention is accomplished on the basis of the following finding. Assuming that either one of the binary and ternary layers which has a smaller energy band gap Eg is referred to as "well" and the other layer, which has a larger energy band gap Eg is referred to as "barrier" and their respective thicknesses are denoted by $L_W$ and $L_B$, respectively, it is important to adjust the $L_W/L_B$ in advance for a mixed crystal having a metallurgically average composition, which is formed on the assumption that the above-described superlattice structure induces disordering, so that the mixed crystal is also lattice-matched with the previous crystal. It has also been found that, when the $L_W/L_B$ ratio is within ±15% from a calculated value, similar advantageous effects are obtained.

This growth method has the following advantages. Namely, it is possible to considerably ease the strictness required for control of the $V^1/V^2$ element ratio and the substrate temperature when two different V-group elements are simultaneously supplied. In general, when a binary layer is sandwiched between superlattice crystal layers, microscopic irregularities on the surfaces of the crystal layers are flattened to provide a crystal having an extremely flat surface, i.e., excellent surface morphology, so that it is possible to prevent generation of a surface energy level and growth of a multi-element mixed crystal portion which does not lattice-match with the substrate at the interface. Further, when an optimal $L_W/L_B$ ratio is selected, even if the superlattice structure is mixed during an element producing process to induce disordering, it becomes a lattice-matched quaternary mixed crystal. Therefore, there is no induction of any large internal lattice strain or misfit dislocation.

The thicknesses $L_W$ and $L_B$ of films to be formed can be controlled to the Å order by MBE (Molecular Beam Epitaxy) and OMVPE (Organometal Vapor Phase Epitaxy). In a superlattice structure wherein $L_B \leq 25$ Å, free tunneling of electrons may take place, and in such case, this superlattice structure may electrically be regarded as substantially equal to a quaternary mixed crystal having a metallurgically average composition as is known from the Kronig-Penny model.

Practical examples will be described below. In one example, a superlattice structure consisting of InP and $In_{0.53}Ga_{0.47}As$ is grown on an InP substrate; in the other example, a superlattice structure consisting of GaAs and $In_{0.49}Ga_{0.51}P$ is grown on a GaAs substrate. In the former example, InGaAs serves as a well, while InP serves as a barrier, and a superlattice structure which is equivalent to a metallurgically average quaternary mixed crystal $In_xGa_{1-x}As_yP_{1-y}$. To allow this superlattice structure to be mixed-crystallized so as to lattice-match with InP, it is necessary to satisfy the condition of $y \simeq 2.16$ $(1-x)$ (see "Semiconductor Lasers and Heterojunction LEDs" H. Kressel, J. K. Butler Academic Press New York (1977) p.392). In the case of a superlattice structure consisting of $In_zGa_{1-z}As$ ($Z=0.537$) having a thickness $L_W$ and InP having a thickness $L_B$, $R \equiv L_W/L_B$ is required to satisfy the quadratic expression: $1.16(1-Z)R^2 + 1.16R - Z = 0$. For this reason, it is necessary to meet the condition of $L_W/L_B \simeq 0.392$. However, it has been found that it suffices to set the $L_W/L_B$ ratio within a range from 0.33 to 0.45 in practice.

Under the above-described condition, the average composition of the quaternary mixed crystal is $In_{0.87}Ga_{0.13}As_{0.28}P_{0.72}$. The energy band gaps of InP, $In_{0.87}Ga_{0.13}As_{0.28}P_{0.72}$ and $In_{0.53}Ga_{0.47}As$ are 1.35 eV, 1.14 eV and 0.75 eV, respectively (see "Heterostructure Lasers, Part B" H. C. Casey, Jr. M. B. Panish Academic Press, New York, (1978) p.40). It is therefore possible to design a quantum well type long wavelength laser by following an optimum structure for GaAlAs multiple quantum well lasers (see W. T. Tsang, Appl Phys Lett 39 (1981) p.780).

In the latter example, GaAs serves as a well, while InGaP serves as a barrier, and the condition of $y \simeq 1-2.04x$, under which the metallurgically average quaternary mixed crystal $In_xGa_{1-x}As_yP_{1-y}$ lattice-matches with GaAs, has been found to be substantially satisfied irrespective of the $L_W/L_B$ ratio. This means that it is possible to produce a quaternary layer $In_xGa_{1-x}As_yP_{1-y}$ having any desired average composition between GaAs and $In_{0.49}Ga_{0.51}P$ by appropriately setting $L_W$ and $L_B$:

$$\left( x \simeq \left( \frac{0.49 L_B}{L_W + L_B} \right), y \simeq \left( \frac{L_W}{L_W + L_B} \right) \right)$$

In addition, when a superlattice structure is grown by MBE or OMVPE, even if the film thickness ratio between GaAs and InGaP is deviated from a predetermined value, since the lattice matching condition is satisfied, it is possible to readily produce a superlattice structure without any fear of misfit dislocation being induced, provided that the device structure concerned permits slight deviation of composition to be ignored. Further, gradual change of the film thickness ratio enables production of a graded layer in which the energy level is inclined with respect to the thickness. Furthermore, employment of a (binary/ternary) superlative structure in place of a quaternary growth layer enables avoidance of the problem of mixing instability during growth due to the existence of so-called miscibility-gap, so that it becomes possible to obtain a mirror-surface epitaxial film even at a relatively low growth temperature.

As has been described above, it has been found that the crystal structure according to the present invention enables semiconductor devices employing a quantum well structure to be readily produced, such as FETs, bipolar transistors, photodiodes, long and short wavelength lasers and light-emitting diodes, and the present invention is considerably effective in improving characteristics of such semiconductor devices.

BRIEF DESCRIPTION OF DRAWINGS

FIG. 1b shows an equivalent model of the conduction band shown in FIG. 1a in the case where electron tunneling effect or disordering of the superlattice structure is induced in the same laser as that shown in FIG. 1a.

BEST MODE FOR CARRYING OUT THE INVENTION

EXAMPLE 1

An example in which a superlattice layer according to the present invention is employed as a barrier layer in a quantum well active layer will be described below.

Figure 1A:
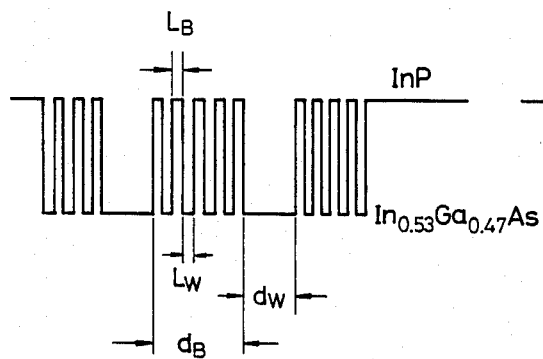
FIG. 1a schematically shows the conduction band of a quantum well laser in which a cladding layer is defined by InP grown on an InP substrate, a well layer in a quantum well active layer is defined by $In_{0.53}Ga_{0.47}As$ and a barrier layer therein is defined by an ($InP/In_{0.53}Ga_{0.47}As$) superlattice structure (the average composition is the same as that of an $In_{0.87}Ga_{0.13}As_{0.28}P_{0.72}$ quaternary mixed crystal).
Figure 1B:
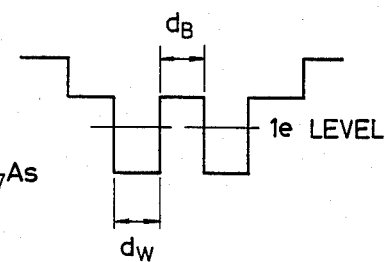

FIGS. 1a and 1b show the conduction band of an active layer portion of a quantum well type long wavelength laser formed by successively growing an n-InP cladding layer (n~$1 \times 10^{18}$, 3 μm), an undoped quantum well active layer and a p-InP cladding layer (p~$1 \times 10^{18}$, 2 μm) on an n+-InP substrate by OMVPE. In this arrangement, the quantum well active layer consists of a quantum well layer which is defined by a single layer of $In_{0.53}Ga_{0.47}As$ with a thickness of $d_w = 70$ Å ~ 120 Å and a barrier layer which is defined by an ($InP/In_{0.53}Ga_{0.47}As$) superlattice structure according to the present invention. The thickness $L_B$ of InP serving as a barrier layer in the superlattice layer was set so as to satisfy the condition of $L_B \leq 25$ Å so that tunneling of electrons would take place effectively, and two different superlattice layers were prepared in accordance with the condition of $L_W/L_B \simeq 0.392$, i.e., $(L_W/L_B) \simeq (8 \text{ Å}/20 \text{ Å})$ and $(L_W/L_B) \simeq (4 \text{ Å}/10 \text{ Å})$. The thickness $d_B$ of one group of superlattices constituting the barrier layer was set to $d_B \simeq 84 \sim 112$ Å so that electrons within each of the wells in the multiple quantum well structure were prevented from tunneling. The above-described semiconductor layers constituting a quantum well structure were formed by the use of a known MBE method. This crystal was etched into a mesa shape having a width of 2 μm by conventional photolithography and then subjected to liquid phase epitaxy to produce a buried type (BH) laser. Thus, it was possible to obtain a device which had a threshold current value that was about a half (10 mA or less) of that of conventional InGaAsP/InP lasers produced by liquid phase epitaxy at a wavelength of 1.3 to 1.55 μm, and which showed excellent temperature characteristics. A laser produced by MBE also had excellent characteristics similar to the above. It should be noted that similar results were obtained under the condition of $L_W/L_B = 0.33$ to $0.45$.

EXAMPLE 2

Figure 2A:
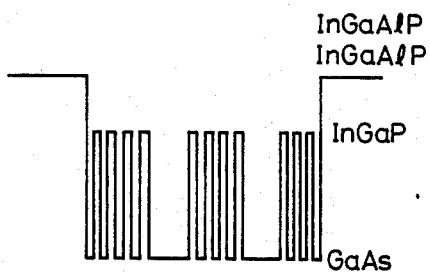
FIGS. 2a and 2b show in combination a quantum well laser in which a cladding layer is defined by InGaAlP grown on a GaAs substrate, a well layer in a quantum well active layer is defined by GaAs and a barrier layer therein is defined by a ($GaAs/In_{0.49}Ga_{0.41}P$) superlattice structure (the average composition can be set so as to be intermediate between the respective compositions of the two different compounds by setting the film thickness ratio therebetween as desired, FIG. 2a schematically showing the conduction band, and FIG. 2b showing an equivalent model of the conduction band.
Figure 2B:
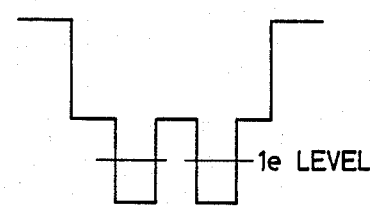

FIGS. 2a and 2b show the conduction band of an active layer portion of a quantum well type visible light laser formed by successively growing an n-$In_uGa_vAl_{1-u-v}P$ cladding layer (n~$1 \times 10^{18}$, 3 μm), an undoped quantum well active layer, a p-(In$_u$Ga$_v$Al$_{1-u-v}$)P cladding layer (p~1×10$^{18}$, 2 μm) and a P-GaAs gap layer (1 μm) on an n+-GaAs substrate by MBE. In this arrangement, the quantum well active layer consists of a quantum well layer which is defined by a single layer of GaAs with a thickness of d$_W$=40 Å ~ 100 Å and a barrier layer which is defined by a (GaAs/In$_{0.49}$Ga$_{0.51}$P) superlattice structure according to the present invention. The thickness L$_B$ of InGaP was set so as to satisfy the condition of L$_B$≦25 Å so that tunneling of electrons would take place effectively. The thickness d$_B$ of one group of superlattices constituting the barrier layer was set to d$_B$=60 Å ~ 100 Å so that electrons within each well were prevented from tunneling. In this case, the L$_W$/L$_B$ ratio was appropriately adjusted within a range of L$_W$, L$_B$<30 Å in accordance with the oscillation wavelength. The composition (In$_u$Ga$_v$Al$_{1-u-v}$)P of the cladding layer was appropriately selected from a range from In$_{0.49}$Ga$_{0.51}$P (E$_g$~1.88 eV) to In$_{0.49}$Ga$_{0.41}$P (E$_g$~2.25 eV) so that lattice matching with GaAs was obtained in accordance with the oscillation wavelength. From this crystal, a stripe laser employing an SiO$_2$ film as a current confinement layer was produced. The obtained device had a low threshold current density, i.e., 1 KA/cm$^2$, at an oscillation wavelength of 0.75 μm to 0.65 μm and showed excellent temperature characteristics. As to the optical output, current-optical output characteristics which had excellent linearity up to 20 mW were obtained.

EXAMPLE 3

Figure 3A:
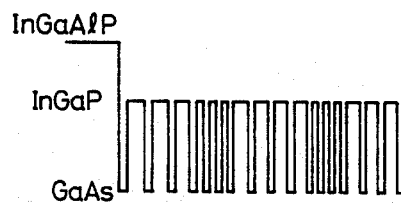
FIGS. 3a and 3b are views employed to describe a quantum well layer in which the well layer in the arrangement shown in FIG. 2a is also defined by a ($GaAs/In_{0.49}Ga_{0.51}P$) superlattice structure, thereby shortening the oscillation wavelength.
Figure 3B:
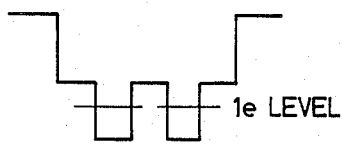

FIGS. 3a and 3b show in combination a laser in which the well layer in the active layer is also defined by a superlattice structure according to the present invention. It was possible, according to this example, to obtain a device having an oscillation wavelength of 0.70 to 0.65 μm.

EXAMPLE 4

Figure 4:
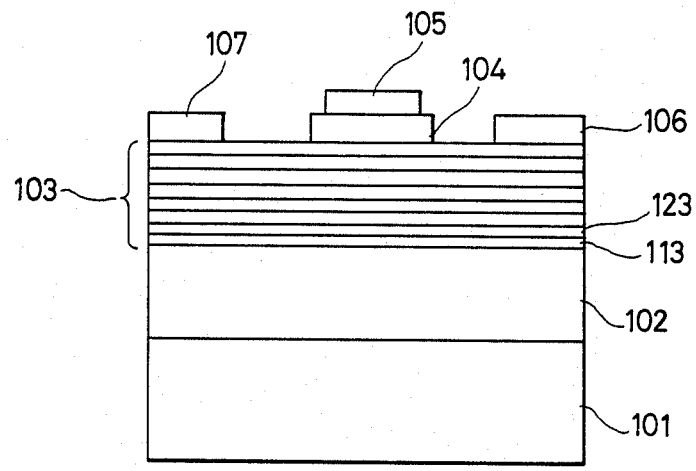
FIG. 4 is a sectional view of a device shown in Example 4.
Figure 5:
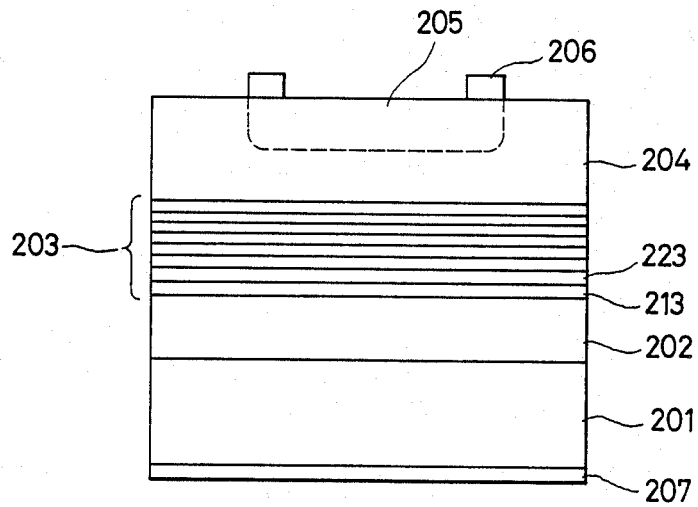
FIG. 5 is a sectional view of a device shown in Example 5.

An example of an FET having an arrangement shown in FIG. 4 will be explained below.

An undoped (an impurity concentration of 10$^{14}$ cm$^{-3}$ or less) InP buffer layer 102 having a film thickness of 5000 Å was formed on a semiinsulator InP substrate 101 by a known epitaxy method, and a channel layer 103 defined by a superlattice structure according to the present invention was formed on the layer 102. The channel layer 103 was formed by a known MBE method by alternately stacking 100 InP layers (film thickness: 15 Å) 113 having an impurity concentration of ×10$^{17}$ cm$^{-1}$ and 100 InGaAs layers (film thickness: 6 Å) 123. An undoped InAlAs hetero gap layer (film thickness: 5000 Å) was formed in a gate forming region on the channel layer 103, and Al having a film thickness of 2000 Å was formed on the layer 104 by evaporation to provide a gate electrode 105.

AuGe/Ni/Au (film thickness: 2000 Å) was formed in each of the source and drain regions on the channel layer 103 by sputtering and alloyed by a heat treatment at 400° C. for three minutes, thereby forming source and drain electrodes 106 and 107. The obtained FET had the following characteristics: a gate length of 0.3 μm; a source-drain spacing of 1 μm; a transconductance of about 300 ms/mm; and a cut-off frequency of 60 GHz.

EXAMPLE 5

An example in which the present invention is applied to a photodiode is explained below.

An n+-InP buffer layer 202 was formed on an n+-InP substrate 201 by epitaxy, and a superlattice layer 203 according to the present invention was formed as a light absorbing layer on the buffer layer 202 by molecular beam epitaxy and/or organometal vapor phase epitaxy. The superlattice layer was formed by stacking InGaAs layers 213 and InP layers 223 by a method similar to that in Example 4.

An n-InP layer 204 having a film thickness of 1 μm was formed on the superlattice layer, and Zn was diffused in a region 205 so as to be a p-region, thereby forming a p-n junction within the n-InP layer 204. Further, a CrAuP electrode 206 and an AuGeNiAu electrode 207 were formed by conventional methods to complete a device.

This device had practical sensitivity at a wavelength of 1.33 to 1.55 μm.

It was also possible to apply the present invention to a light-emitting diode, a bipolar transistor, etc. in addition to the above-described examples.

It should be noted that it is possible, in the above-described embodiments, to utilize a partial change in optical or electrical properties caused by spontaneous mixed crystallization of a part of the superlattice structure or mixed crystallization thereof effected by impurity diffusion or ion implantation.

Further, it is, as a matter of course, possible to apply the technique of the present invention to semiconductor devices employing superlattice layers made of other multi-element compound semiconductors or multielement compound semiconductors each consisting of four or more elements.

Industrial Applicability

It is an object of the present invention to provide a high-performance semiconductor device, e.g., an FET (Field Effect Transistor), a bipolar transistor and a phototransistor which operate at high speed, and a semiconductor laser device which stably oscillates in either a long or short wavelength range. Since the present invention enables a quaternary III-V group crystal of excellent quality to be readily produced on a III-V group substrate, it is possible to obtain various types of semiconductor device having remarkably improved characteristics.

What is claimed is:

1. A semiconductor device comprising a semiconductor layer having a superlattice structure including a first layer of III$^1$-V$^1$ binary crystal and a second layer of III$^1$-III$^2$-V$^2$ ternary crystal, which are formed on a III$^1$-V$^1$ binary crystal substrate composed of a III-group element and a V-group element, each of said first and second layers respectively of binary and ternary crystals lattice-matching with said substrate, and wherein the layer, of the first and second layers, having a larger energy band gap has a thickness of at most 25 Å.

2. A semiconductor device according to claim 1, wherein the film thickness ratio between said III$^1$-V$^1$ binary crystal superlattice layer and said III$^1$-III$^2$-V$^2$ ternary crystal superlattice layer is selected so that a substance produced as a result of mixed-crystallization of said superlattice structure crystal-matches with said substrate.

3. A semiconductor device according to claim 2, wherein said substrate is defined by InP, and said superlattice structure is defined by a combination of superlattice layers which are respectively made of InP (film thickness: $L_B$) and $In_zGa_{1-z}As$ ($Z \simeq 0.537$; film thickness: $L_W$) so that the film thickness ratio $L_W/L_B$ is 0.33 to 0.45.

4. A semiconductor laser device wherein at least one of the active layer, optical guide layer and cladding layer is defined by a superlattice layer including a first layer of $III^1-V^1$ binary crystal and a second layer of $III^1-III^2-V^2$ ternary crystal, which are formed on a $III^1-V^1$ binary crystal substrate composed of a III-group element and a V-group element, each of said first layer and second layer respectively of binary and ternary crystals lattice-matching with said substrate, and wherein the layer, of the first and second layers, having a larger energy band gap has a thickness of at most 25 Å.

5. A semiconductor laser device according to claim 4, wherein the film thickness ratio between said $III^1-V^1$ binary crystal superlattice layer and said $III^1-III^2-V^2$ ternary crystal superlattice layer is selected so that a substance produced as a result of mixed-crystallization of said superlattice structure crystal-matches with said substrate.

6. A semiconductor laser device according to claim 4, wherein said substrate is defined by InP; said active layer is defined by an $In_zGa_{1-z}As$ ($Z \simeq 0.537$) layer; the optical guide layer is defined by a superlattice layer made of a combination of InP (film thickness: $L_B$) and $In_zGa_{1-z}As$ (film thickness: $L_W$) so that $L_W/L_B = 0.33$ to 0.45; and said cladding layer is defined by an InP layer.

7. A semiconductor laser device according to claim 4, wherein said substrate is defined by GaAs; said active layer and/or optical guide layer is defined by a superlattice layer formed from a combination of a GaAs layer and $In_zGa_{1-z}P$ ($Z \simeq 0.490$); and said cladding layer is defined by an InGaAlP layer.

8. A semiconductor laser device according to any one of claims 4 to 7, wherein said superlattice layer is a layer formed by at least one of molecular beam epitaxy (MBE) and organometal vapor phase epitaxy (OMVPE).

9. A semiconductor device according to claim 1, wherein the superlattice structure has a mixed crystal region.

10. A semiconductor device according to claim 9, wherein the mixed crystal region is a region formed spontaneously.

11. A semiconductor device according to claim 9, wherein the mixed crystal region is a region formed by impurity diffusion in the superlattice structure.

12. A semiconductor device according to claim 9, wherein the mixed crystal region is a region formed by ion implantation into the superlattice structure.

13. A semiconductor device comprising:
a $III^1-V^1$ binary crystal substrate; and
a superlattice structure formed on the substrate, including a plurality of well layers and a plurality of barrier layers, wherein the well layers and the barrier layers are lattice-matched with the substrate, each barrier layer has a thickness of at most 25 Å, and the well layers and the barrier layers are each $III^1-III^2-V^2$ ternary crystal layers or $III^1-III^2-V^2$ ternary crystal layers and $III^1-V^1$ binary crystal layers respectively.

14. A semiconductor device according to claim 13, wherein a thickness ratio $L_W/L_B$ (where $L_W$: thickness of the well layer, and $L_B$: thickness of the barrier layer) is coincident with a predetermined value so that a mixed crystal region of the superlattice structure is lattice-matched with the substrate layer.

15. A semiconductor device according to claim 14, wherein the ratio $L_W L_B$ is in the range 0.33–0.45.

16. A semiconductor device according to claim 13, wherein the substrate is a layer of the binary crystal.

* * * * *